US012696484B2

(12) United States Patent　　　　(10) Patent No.:　US 12,696,484 B2
Wu et al.　　　　　　　　　　　　　(45) Date of Patent:　　　Jul. 28, 2026

(54) BACK-END-OF-LINE VERTICAL-TRANSPORT TRANSISTOR

(71) Applicant: INTERNATIONAL BUSINESS MACHINES CORPORATION, Armonk, NY (US)

(72) Inventors: Heng Wu, Santa Clara, CA (US); Julien Frougier, Albany, NY (US); Ruilong Xie, Niskayuna, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 821 days.

(21) Appl. No.: 17/655,371

(22) Filed: Mar. 18, 2022

(65) Prior Publication Data

US 2023/0299205 A1　　Sep. 21, 2023

(51) Int. Cl.
　H10D 30/67　　　(2025.01)
　H10D 30/01　　　(2025.01)
(52) U.S. Cl.
　CPC ....... H10D 30/6728 (2025.01); H10D 30/031 (2025.01); H10D 30/0318 (2025.01); H10D 30/6713 (2025.01); H10D 30/6729 (2025.01)
(58) Field of Classification Search
　CPC ......... H01L 29/78642; H01L 29/41733; H01L 29/66742; H01L 29/78618; H01L 29/7869; H01L 29/78696; H10D 30/6728; H10D 30/6713; H10D 30/6755; H10D 30/6757; H10D 30/031; H10D 30/6729; H10D 30/63; H10D 30/025; H10D 84/016; H10D 84/0195
See application file for complete search history.

(56) References Cited

U.S. PATENT DOCUMENTS

| | | | | |
|---|---|---|---|---|
| 5,136,350 | A | * | 8/1992 | Itoh .......................... H10D 30/63 257/E21.41 |
| 6,838,721 | B2 | | 1/2005 | Garni |
| 8,461,002 | B2 | | 6/2013 | Forbes |
| 8,754,417 | B2 | | 6/2014 | Christensen |
| 9,853,053 | B2 | | 12/2017 | Lupino |

(Continued)

FOREIGN PATENT DOCUMENTS

CN　　　　107431073 A　　12/2017

OTHER PUBLICATIONS

Si et al., "BEOL Compatible Indium-Tin-Oxide Transistors: Switching of Ultra-High-Density 2D Electron Gas over 0.8×10 14/cm 2 by Ferroelectric Polarization," 2021 International Symposium on VLSI Technology, Systems and Applications (VLSI-TSA). IEEE, 2021, 2 pp.

(Continued)

*Primary Examiner* — Britt Hanley
*Assistant Examiner* — Jason James Greaving
(74) *Attorney, Agent, or Firm* — L. Jeffrey Kelly

(57)　　　　ABSTRACT

A semiconductor structure including a bottom source drain region arranged above front-end-of-line circuitry, a gate region disposed above and insulated from the bottom source drain region, a top source drain region disposed above and insulated from the gate region, and a channel region adjacent to the gate region and extending vertically from a top surface of the bottom source drain region to a bottom surface of the top source drain region.

20 Claims, 15 Drawing Sheets

200

(56) References Cited

U.S. PATENT DOCUMENTS

| | | | | |
|---|---|---|---|---|
| 10,020,381 | B1 * | 7/2018 | Fan | .................. H01L 21/76895 |
| 10,297,580 | B2 | 5/2019 | Or-Bach | |
| 10,522,686 | B2 | 12/2019 | Leobandung | |
| 10,580,709 | B2 * | 3/2020 | Cheng | ..................... H01L 21/84 |
| 10,727,139 | B2 | 7/2020 | Hook | |
| 2016/0005850 | A1 * | 1/2016 | Zhao | ................... H10D 62/292 |
| | | | | 257/329 |
| 2018/0122825 | A1 | 5/2018 | Lupino | |
| 2019/0131187 | A1 | 5/2019 | Le | |
| 2021/0020747 | A1 * | 1/2021 | Chen | ...................... H10D 89/10 |
| 2021/0288171 | A1 * | 9/2021 | Lee | ........................ H10D 62/80 |
| 2022/0399339 | A1 * | 12/2022 | Chen | ...................... H10B 12/05 |
| 2023/0034575 | A1 * | 2/2023 | Yoshida | ............ H01L 29/66969 |
| 2023/0269931 | A1 * | 8/2023 | Lee | .................. H01L 29/42392 |
| | | | | 257/296 |

OTHER PUBLICATIONS

Li et al., "Nanometre-thin indium tin oxide for advanced high-performance electronics," Nature Materials, vol. 18, Oct. 2019, pp. 1091-1097.

* cited by examiner

BACK-END-OF-LINE
VERTICAL-TRANSPORT TRANSISTOR

BACKGROUND

The present invention generally relates to semiconductor structures, and more particularly to a vertical transistor structure integrated into the back-end-of-line.

Vertical-transport transistors are an attractive option for technology scaling for 5 nm and beyond technologies. Vertical transistors have a channel oriented perpendicular to the substrate surface, as opposed to being situated along the plane of the surface of the substrate in the case of a lateral transistor. By using a vertical design, it is possible to increase packing density. That is, by having the channel perpendicular to the substrate, vertical transistors improve the scaling limit beyond lateral transistors.

SUMMARY

According to an embodiment of the present invention, a semiconductor structure is provided. The semiconductor structure may include a bottom source drain region arranged above front-end-of-line circuitry, a gate region disposed above and insulated from the bottom source drain region, a top source drain region disposed above and insulated from the gate region, and a channel region adjacent to the gate region and extending vertically from a top surface of the bottom source drain region to a bottom surface of the top source drain region.

According to another embodiment of the present invention, a semiconductor structure is provided. The semiconductor structure may include bottom source drain regions arranged above front-end-of-line circuitry, a single gate region disposed above and insulated from the bottom source drain regions, top source drain regions disposed above and insulated from the single gate region, and channel regions adjacent to the gate region, each channel region extending vertically from a top surface of one of the bottom source drain regions to a bottom surface of one of the top source drain regions.

According to another embodiment of the present invention, a semiconductor structure is provided. The semiconductor structure may include a bottom source drain region arranged above front-end-of-line circuitry, a single gate region disposed above and insulated from the bottom source drain region, a top source drain region disposed above and insulated from the single gate region, and a channel region surrounding the gate region, the channel region extending vertically from a top surface of the bottom source drain region to a bottom surface of the top source drain region.

BRIEF DESCRIPTION OF THE DRAWINGS

The following detailed description, given by way of example and not intended to limit the invention solely thereto, will best be appreciated in conjunction with the accompanying drawings, in which:

FIG. 1 is a cross-sectional view of a semiconductor structure during an intermediate step of a method of fabricating a back-end-of-line vertical-transport transistor according to an exemplary embodiment;

FIG. 2 is a cross-sectional view of the semiconductor structure after forming a gate region according to an exemplary embodiment;

FIG. 3 is a cross-sectional view of the semiconductor structure after forming a gate dielectric according to an exemplary embodiment;

FIG. 4 is a cross-sectional view of the semiconductor structure after forming a channel material layer according to an exemplary embodiment;

FIG. 5 is a cross-sectional view of the semiconductor structure after etching the channel material layer according to an exemplary embodiment;

FIG. 6 is a cross-sectional view of the semiconductor structure after depositing a third dielectric layer, and forming top source drain regions within the third dielectric layer according to an exemplary embodiment;

FIG. 7 is a cross-sectional view of the semiconductor structure after depositing a fourth dielectric layer, and forming contact structures according to an exemplary embodiment;

FIG. 12 is a cross-sectional view of a semiconductor structure during an intermediate step of a method of fabricating a back-end-of-line vertical-transport transistor according to an alternative exemplary embodiment;

FIG. 13 is a cross-sectional view of the semiconductor structure after forming etching a trench and forming gate dielectric spacers according to an exemplary embodiment;

FIG. 14 is a cross-sectional view of the semiconductor structure after forming a channel material layer according to an exemplary embodiment;

FIG. 15 is a cross-sectional view of the semiconductor structure after etching the channel material layer to form vertical channels and depositing a fourth dielectric layer according to an exemplary embodiment; and FIG. 16 is a cross-sectional view of the semiconductor structure after forming contact structures according to an exemplary embodiment.

Figure 1:
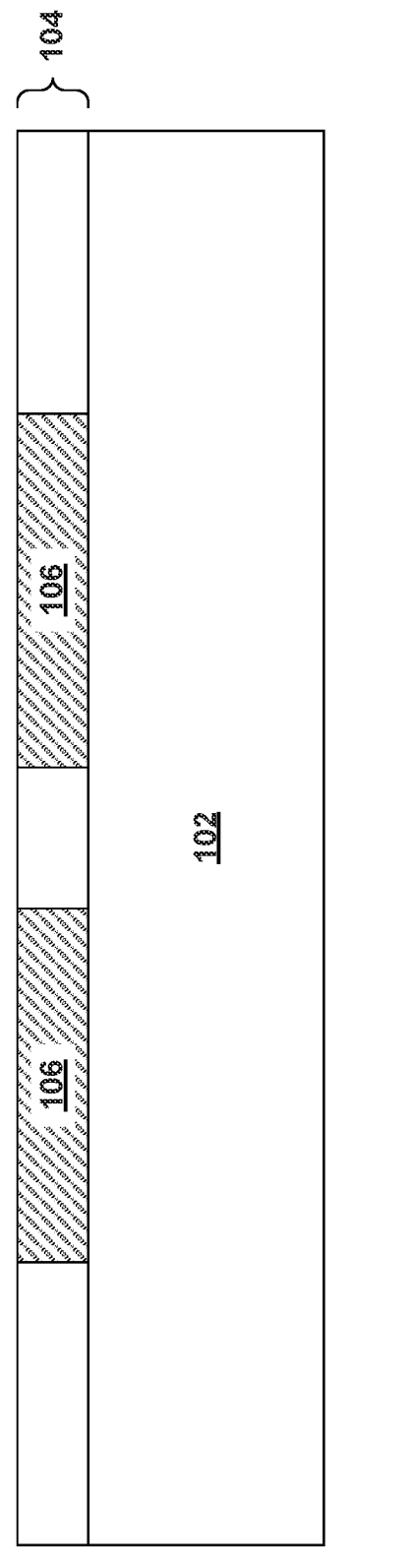
FIGS. 1-7 illustrate the steps of a method of forming a back-end-of-line vertical-transport transistor according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

High performance transistors, for example those used as access transistors for memory cells, are typically fabricated in the front-end-of-line on crystalline silicon substrates adjacent, or close, to an embedded memory cell to reduce resistance. Unfortunately, such embedded memory cells usually require high drive current for standard switching operation, leading to large front-end-of-line transistor footprint and area loss. The embedded memory cell area will occupy the space for logic circuit, causing area loss.

Embodiments of the present invention disclose high performance vertical-transport transistor structures integrated into the back-end-of-line. Such transistor structures can be used for accessing embedded memory cells.

The present invention generally relates to semiconductor structures, and more particularly to a vertical-transport transistor structure integrated into the back-end-of-line. More specifically, the back-end-of-line vertical-transport transistor and associated method disclosed herein provide a novel solution to forming access transistors without requiring long wiring. For example, the transistors disclosed herein can be used as access transistors for non-volatile memory cells in the back-end-of-line. Embodiments of the present invention propose using novel ultra-thin channel materials. The resulting channel is vertically oriented and self-aligned to the gate. As such, the ultra-thin vertically oriented channel saves cell area and enables a more flexible circuit design.

Exemplary embodiments of a back-end-of-line vertical-transport transistor are described in detail below by referring to the accompanying drawings in FIGS. 1 to 16. Those skilled in the art will readily appreciate that the detailed description given herein with respect to these figures is for explanatory purposes as the invention extends beyond these limited embodiments.

FIGS. 1-7 illustrate the steps of a method of forming a back-end-of-line vertical-transport transistor according to an exemplary embodiment. Referring now to FIG. 1, a structure 100 is shown during an intermediate step of a method of fabricating a vertical-transport transistor structure integrated into the back-end-of-line according to an embodiment of the invention. The structure 100 illustrated in FIG. 1 includes an underlying circuit layer 102, a first dielectric layer 104, and bottom source drain regions 106.

The underlying circuit layer 102, as described herein, is representative of front-end-of-line circuitry. As such, the various layers/structures formed atop the underlying circuit layer 102 may be formed in any level above the front-end-of-line, such as, for example, the middle-of-line and the back-end-of-line.

The first dielectric layer 104 is composed of any known interlevel dielectric materials. For example, the first dielectric layer 104 may be composed of silicon oxide ($SiO_x$), undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. As indicated above, the term "low-κ" as used herein refers to a material having a relative dielectric constant κ which is lower than that of silicon dioxide.

In at least one embodiment, the bottom source drain regions 106 are deposited within trenches or recesses formed in the first dielectric layer 104 according to known techniques. In other embodiments, the bottom source drain regions 106 are deposited directly on top of the underlying circuit layer 102 and subsequently patterned, if needed.

It should be understood that the bottom source drain regions 106 may be either one of a source region or a drain region, as appropriate. Illustrative examples of suitable materials for the bottom source drain regions 106 include, but are not limited to, metals or doped non-crystalline silicon. In most cases, the bottom source drain regions 106 are made from a metal.

After forming the first dielectric layer 104 and the bottom source drain regions 106, a planarization technique such as, for example, chemical mechanical planarization (CMP) and/or grinding may be applied. The planarization technique removes excess material and continues polishing until the uppermost surfaces of the bottom source drain regions 106 are flush, or substantially flush, with uppermost surfaces of the first dielectric layer 104.

Figure 2:
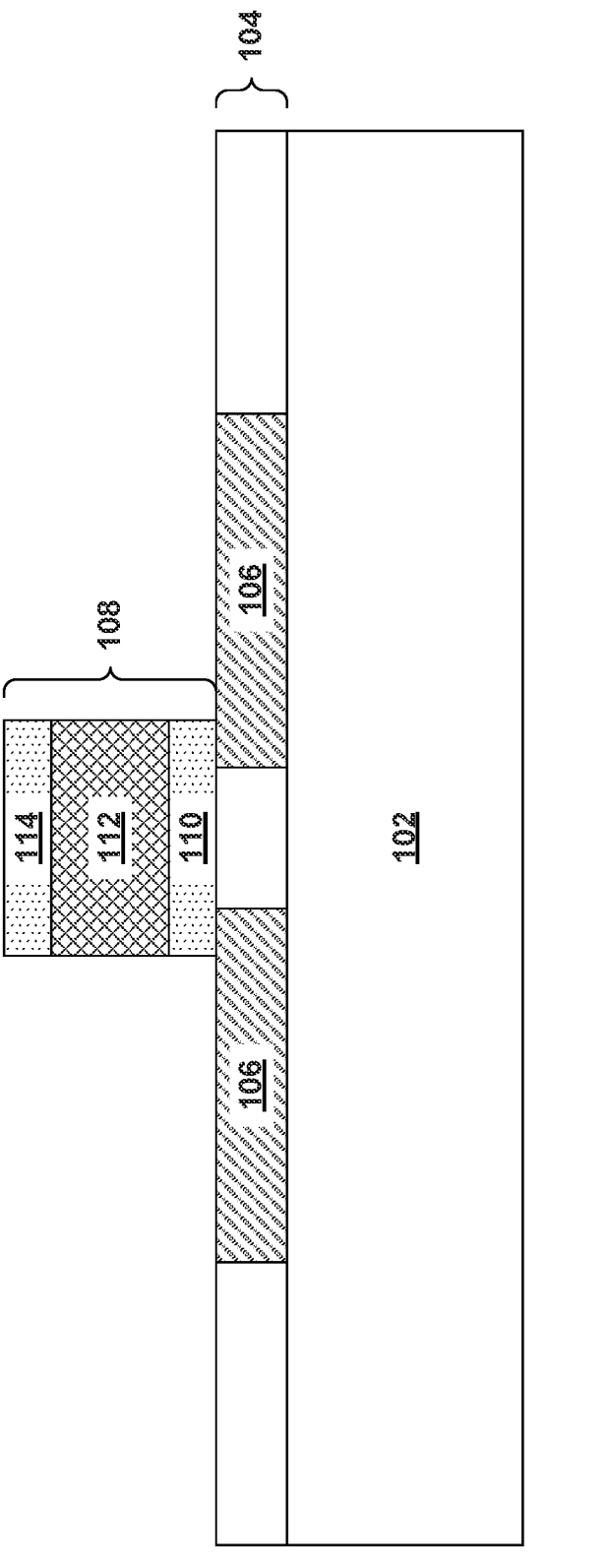

Referring now to FIG. 2, structure 100 is shown after forming a gate region 108 according to an embodiment of the invention. Specifically, the gate region 108 includes a bottom gate spacer 110, a gate 112, and a top gate spacer 114.

First, a bottom spacer material, a gate material, and a top spacer material are sequentially blanket deposited one on top of another above the first dielectric layer 104 and the bottom source drain regions 106 according to known techniques. Next, the bottom spacer material, the gate material, and the top spacer material are patterned to form the gate region 108 including the bottom gate spacer 110, the gate 112, and the top gate spacer 114 according to known techniques.

Suitable spacer materials from which the bottom gate spacer 110 and the top gate spacer 114 may be formed include, but are not limited to, oxides such as silicon oxide ($SiO_x$), nitrides such as silicon nitride ($Si_xN_y$), and/or low-κ materials such as carbon-doped oxide materials containing silicon (Si), carbon (C), oxygen (O), and hydrogen (H) (SiCOH) or siliconborocarbonitride (SiBCN).

In an embodiment, the bottom gate spacer 110 and the top gate spacer 114 can have a thickness ranging from approximately 5 nm to approximately 25 nm. Other thicknesses that are lesser than, or greater than, the aforementioned thickness range can also be used for the bottom gate spacer 110 and the top gate spacer 114. Thicker gate spacers may be used for higher voltages. In all cases, the bottom gate spacer 110 disclosed herein must electrically isolate the gate 112 from the bottom source drain regions 106.

In an embodiment, the gate 112 is composed of an n-type work function metal. As used herein, an "n-type work function metal" is a metal that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In an embodiment, the work function of the n-type work function metal ranges from 4.1 eV to 4.3 eV. In an embodiment, the n-type work function metal is composed of at least one of TiAl, TaN, TIN, HIN, HfSi, or combinations thereof. The n-type work function metal can be formed using chemical vapor deposition atomic layer deposition, sputtering or plating.

In another embodiment, the gate 112 may be a p-type work function metal. As used herein, a "p-type work function metal" is a metal that effectuates a p-type threshold voltage shift. In an embodiment, the work function of the p-type work function metal ranges from 4.9 eV to 5.2 eV. As used herein, "threshold voltage" is the lowest attainable gate voltage that will turn on a semiconductor device, for example, transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In an embodiment, the p-type work function metal may be composed of titanium, titanium nitride or titanium carbide. The p-type work function metal may also be composed of TiAlN, Ru, Pt, Mo, Co and alloys and combinations thereof. In an embodiment, the p-type work function metal can be formed by, a physical vapor deposition method, such as sputtering, chemical vapor deposition, or atomic layer deposition.

Figure 3:
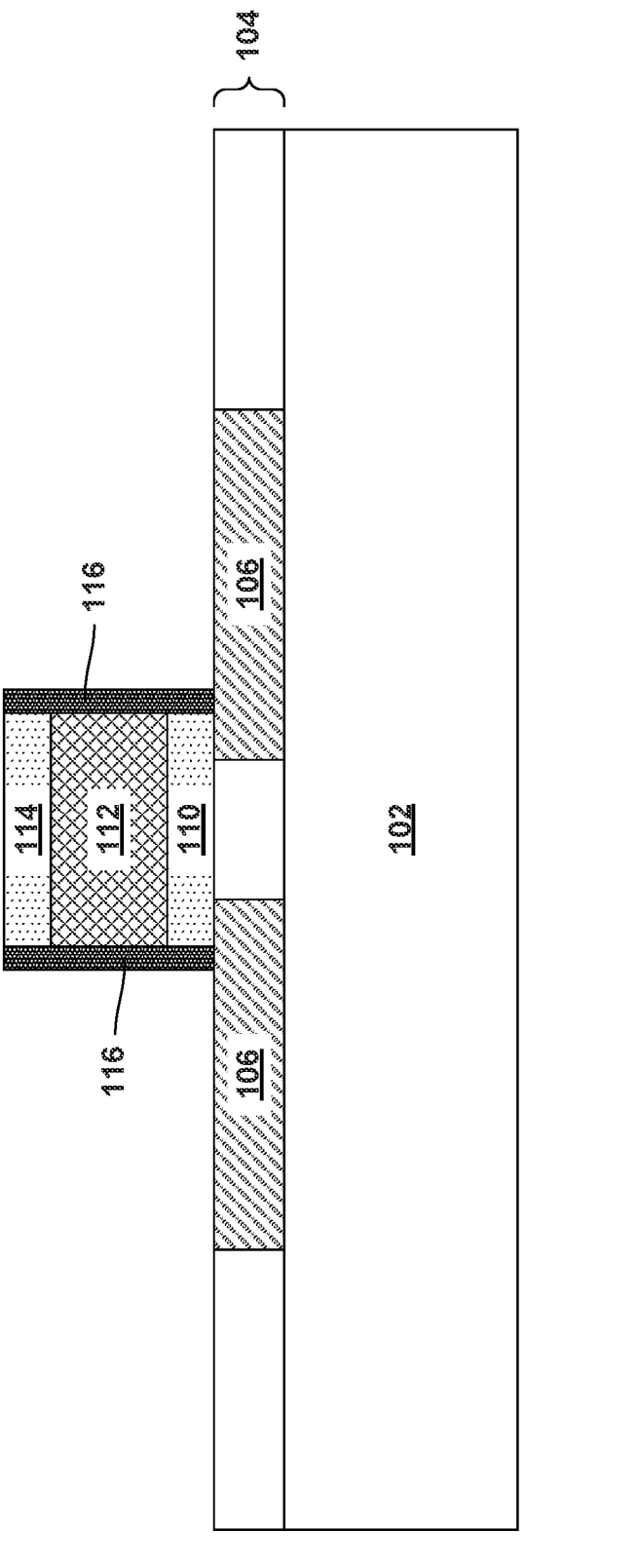

Referring now to FIG. 3, structure 100 is shown after forming a gate dielectric 116 according to an embodiment of the invention.

First, a gate dielectric material layer is conformally deposited directly on exposed surfaces of the structure 100, and specifically the gate region 108. As used herein, "conformal" it is meant that a material layer has a continuous thickness. For example, a continuous thickness generally means a first thickness as measured from a bottom surface to a topmost surface that is the same as a second thickness as measured from an inner sidewall surface to an outer sidewall surface.

The gate dielectric material layer can be formed by any deposition technique including, for example, chemical vapor deposition (CVD), plasma enhanced chemical vapor deposition (PECVD), physical vapor deposition (PVD), sputtering, or atomic layer deposition (ALD). In an embodiment, the gate dielectric material layer can have a thickness ranging from approximately 1.5 nm to approximately 5 nm. Other thicknesses that are lesser than, or greater than, the aforementioned thickness range can also be used for the gate dielectric material layer.

The gate dielectric material layer is composed of any known gate dielectric materials, for example, oxide, nitride, and/or oxynitride. In an example, the gate dielectric material layer can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure includes different gate dielectric materials. For example a silicon dioxide layer and a high-k gate dielectric layer can be formed and used together as the gate dielectric material layer.

Next, portions of the gate dielectric material layer are removed using know anisotropic etching techniques. For example, known dry etching techniques, such as, for example, reactive ion etching, ion beam etching, plasma etching, or laser ablation can be used to remove positions of the gate dielectric material layer from horizontal surfaces of the structure 100. Meanwhile, other portions of the gate dielectric material layer remain on vertical sidewalls of the gate region 108 and form the gate dielectric 116. In a primary example, the gate dielectric 116 is disposed on two opposite sides of the gate region 108; however alternative options are available and described below with reference to FIG. 9.

Figure 4:
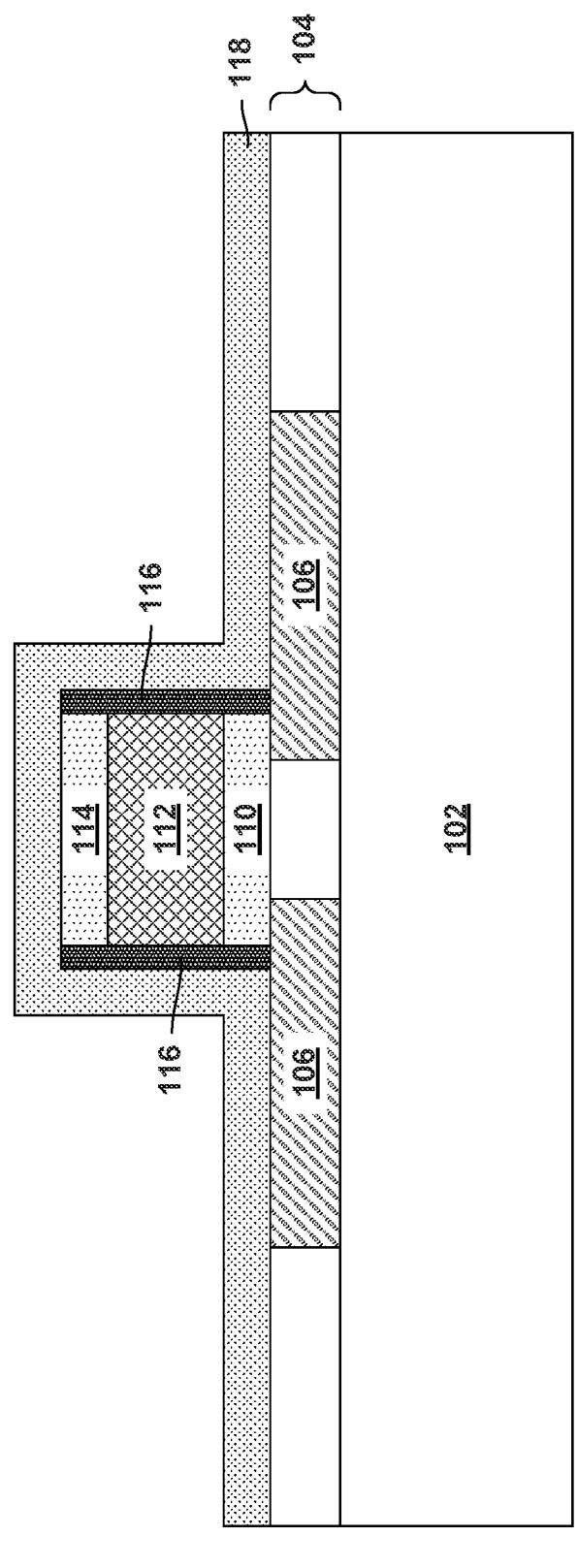

Referring now to FIG. 4, structure 100 is shown after forming a channel material layer 118 according to an embodiment of the invention.

First, the channel material layer 118 is conformally deposited directly on exposed surfaces of the structure 100, and specifically the gate region 108 and the gate dielectric 116. The channel material layer 118 can be formed by any deposition technique including, for example, chemical vapor deposition (CVD), plasma enhanced chemical vapor deposition (PECVD), physical vapor deposition (PVD), sputtering, or atomic layer deposition (ALD). In an embodiment, the channel material layer 118 can have a thickness in ranging from approximately sub-1 nm to approximately 10 nm. Other thicknesses that are lesser than, or greater than, the aforementioned thickness range can also be used for the channel material layer 118.

According to embodiments of the present invention, the channel material layer 118 is composed of, for example, non-crystalline silicon materials such as semiconductor oxides, semiconductor 2D-materials, semiconductor topological insulators as well as amorphous or polycrystalline Silicon or Silicon-Germanium. In an embodiment, the channel material layer 118 is indium oxide, indium tin oxide, indium gallium zinc oxide, or indium aluminum zinc oxide. In another embodiment, the channel material layer 118 is amorphous silicon, or polycrystalline silicon, or silicon germanium. In all cases, the channel material layer 118 is not bound or limited by a base substrate material.

Further, the chosen material for the channel material layer 118 should have semiconducting properties, high carrier mobility, capable of being conformally deposited, and back-end-of-line compatible. By back-end-of-line compatible, process temperatures, for example deposition, are low enough to prevent damage to the pre-existing front-end-of-line, and specifically prevent metals in the front-end-of-line from melting and/or diffusing.

In some embodiments, the channel material layer 118 may be multilayered including different layers of different materials. For example, in an embodiment, the channel material layer 118 includes a layer of indium tin oxide (ITO) combined with a layer of indium gallium zinc oxide (IGZO).

Figure 5:
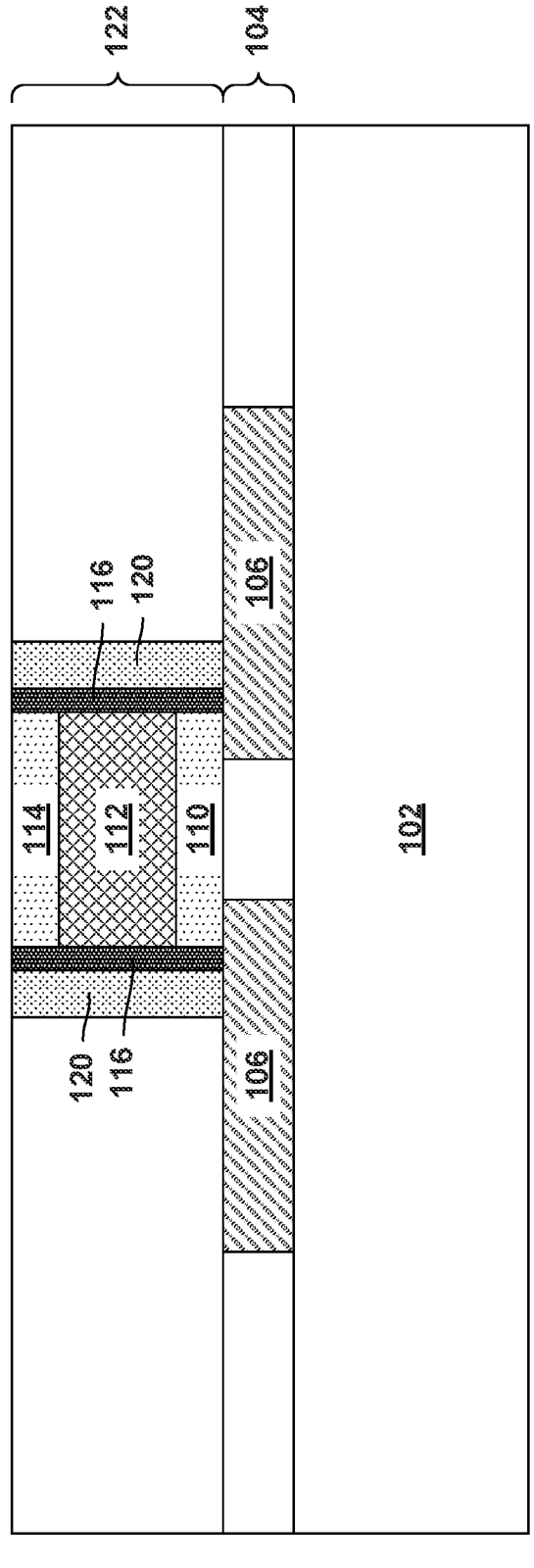

Referring now to FIG. 5, structure 100 is shown after etching the channel material layer 118 to form vertical channels 120 and depositing a second dielectric layer 122 according to an embodiment of the invention.

First, portions of the channel material layer 118 are removed using know anisotropic etching techniques. For example, known dry etching techniques, such as, for example, reactive ion etching, ion beam etching, plasma etching can be used to remove positions of the channel material layer 118 from horizontal surfaces of the structure 100. Meanwhile, other portions of the channel material layer 118 remain on vertical sidewalls of the gate region 108, and more specifically, along vertical sidewalls of the gate dielectric 116.

Next, the second dielectric layer 122 is deposited over and across the entire structure 100 in a similar manner and with similar materials as the first dielectric layer 104 described above.

After etching the channel material layer 118 and depositing the second dielectric layer 122, a planarization technique such as, for example, chemical mechanical planarization (CMP) and/or grinding is applied. The planarization technique removes excess material of the second dielectric layer 122 and continues polishing until the uppermost surfaces of the vertical channels 120, the gate dielectric 116, and the top gate spacer 114 are exposed. After polishing, the uppermost surfaces of the vertical channels 120, the gate dielectric 116, and the top gate spacer 114 are flush, or substantially flush, with uppermost surfaces of the second dielectric layer 22. Alternatively, like the first dielectric layer 104 described above, the second dielectric layer 122 may include a self-planarizing material which may obviate the need to perform a subsequent planarizing step.

Figure 6:
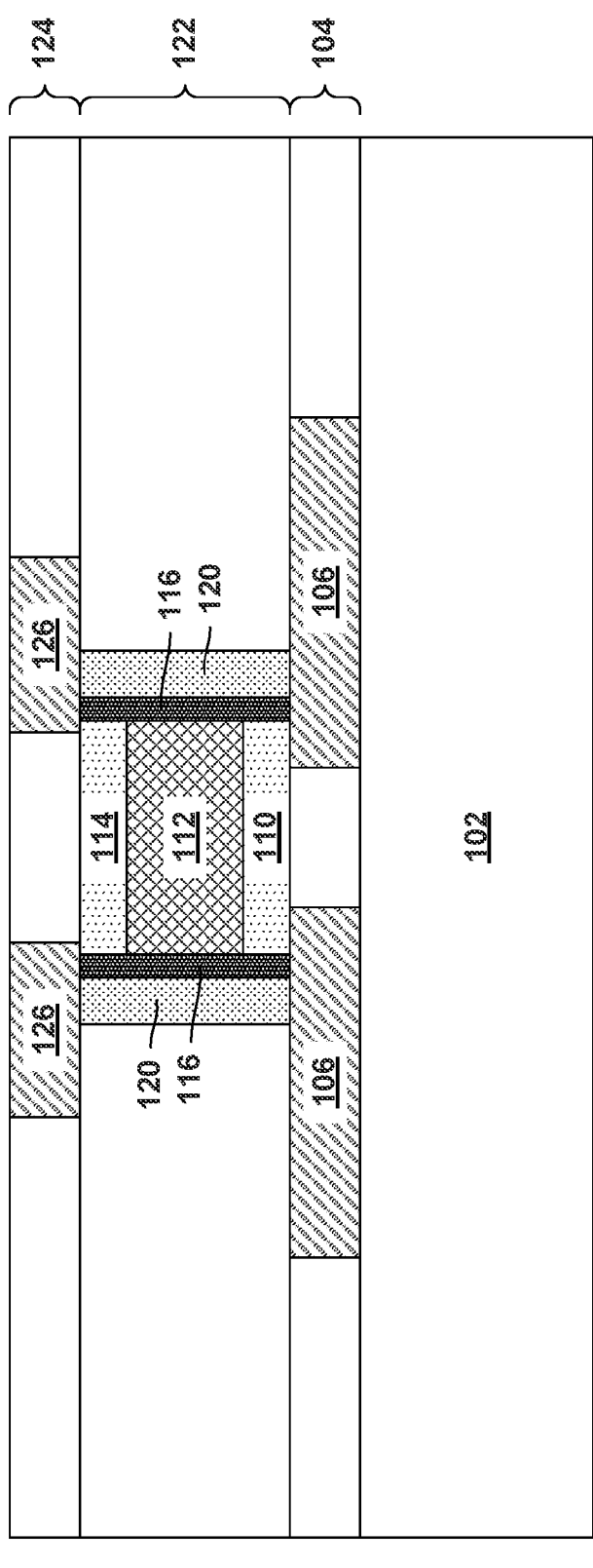

Referring now to FIG. 6, structure 100 is shown after depositing a third dielectric layer 124, and forming top source drain regions 126 within the third dielectric layer 124 according to an embodiment of the invention.

Figure 7:
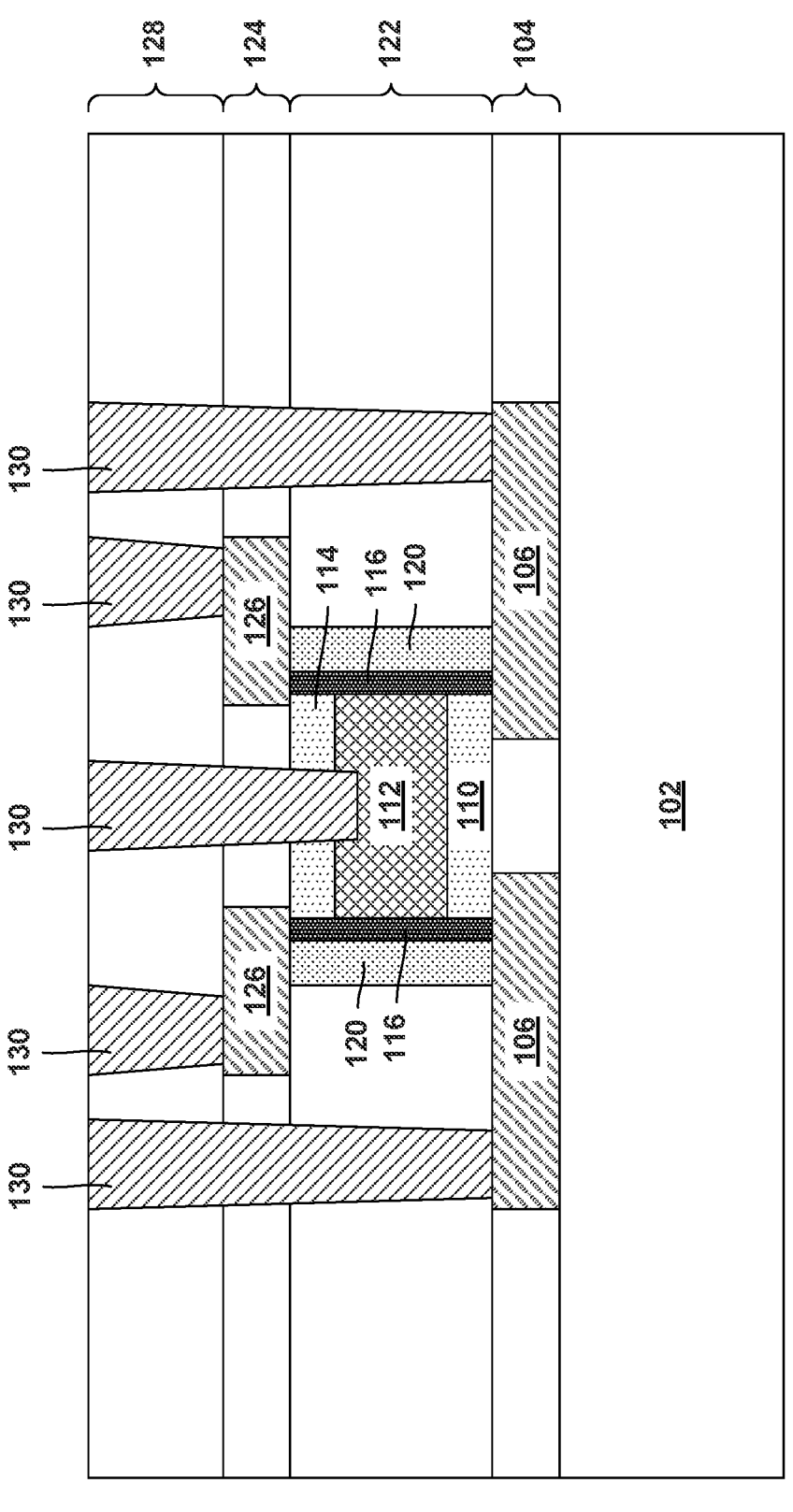

The third dielectric layer 124 and the top source drain regions 126 are formed in a similar manner and with similar materials as the first dielectric layer 104 and the bottom source drain regions 106 described above. According to embodiments of the present invention, it is critical that each of the top source drain regions 126 are laterally shorter, or smaller, than the bottom source drain regions 106. Alternatively, in accordance with embodiments of the present invention, a lateral width of the bottom source drain regions 106 must be larger than a lateral width of the top source drain regions 126, as illustrated. Doing so, provides the structural building blocks to subsequently form electrical contacts for the bottom source drain regions 106, as illustrated in FIG. 7. Persons having skill in the art appreciate that other structural modifications are possible to enable formation of electrical contacts with the bottom source drain regions 106. For example, the bottom source drain regions 106 may be larger in a different lateral direction than illustrated.

Finally, like above, a planarization technique such as, for example, chemical mechanical planarization (CMP) and/or grinding is applied. The planarization technique removes excess material and continues polishing until the uppermost surfaces of the top source drain regions 126 are flush, or substantially flush, with uppermost surfaces of the third dielectric layer 124.

Referring now to FIG. 7, structure 100 is shown after depositing a fourth dielectric layer 128, and forming contact structures 130 according to an embodiment of the invention.

First, the fourth dielectric layer 128 is deposited over and across the entire structure 100 in a similar manner and with similar materials as the first dielectric layer 104 described above. Next, contact trenches are formed and then subsequently filled with a conductive material, and appropriate liners if needed, to form the contact structures 130 illustrated.

In an embodiment, contact trenches of different depths are patterned and etched, and all contact trenches are simultaneously filled with the conductive material. In a typical fashion, contact trenches having similar depths will be patterned and etched together. Therefore, multiple different patterning and etching sequences would be required to produced contact trenches having multiple different depths. Alternatively, different conductive materials can be used. In such cases, for example, contact trenches of different depths are etched successively, some contact trenches are filled a first conductive material, and other contact trenches are subsequently filled with a second conductive material.

The contact structures 130 may include any suitable conductive material, such as, for example, copper, aluminum, tungsten, cobalt, or alloys thereof. Examples of deposition techniques that can be used in depositing the conductive material include, for example, chemical vapor deposition (CVD), plasma enhanced chemical vapor deposition (PECVD), or atomic layer deposition (ALD). In some cases, an electroplating technique can be used to form the contact structures 130. Further, a diffusion barrier can be conformally deposited within the contact trenches prior to filling the contact trenches with the conductive material according to known techniques. Such diffusion barriers may be composed of known materials, such as, for example, titanium, titanium nitride, or some combination thereof.

After deposition, a planarization technique such as, for example, chemical mechanical planarization (CMP) and/or grinding is applied. The planarization technique removes excess conductive material of the contact structures 130 from above the fourth dielectric layer 128. After polishing, upper surfaces of the contact structures 130 are flush, or substantially flush, with uppermost surfaces of the fourth dielectric layer 128.

As illustrated in FIG. 7, the vertical-transport transistor device represented by the structure 100 in this example has some distinctive notable features. For instance, the structure 100 is symmetrical and includes two vertically oriented channel regions 120 controlled by a single gate 112. As used herein, "vertically oriented channel" refers to the physical orientation of the channel as well as the function of the vertical-transport transistor device. More specifically, during operation carrier transport occurs vertically from the bottom source drain regions 106 to the top source drain regions 126, or vice versa. Similarly, an effective gate length of the vertical-transport transistor device represented by the structure 100 is directly related to the height or thickness of the gate 112. As such, adjusting the gate length of the vertical-transport transistor device represented by the structure 100 will not impact the footprint of the device. Stated differently, increasing the effective gate length of the vertical-transport transistor device represented by the structure 100 will not increase the footprint of the device.

Another distinctive notable feature, the vertical-transport transistor device represented by the structure 100 does not require a crystalline silicon substrate to form the channel region. This tremendously increases the integration flexibility of the disclosed devices. Since a silicon substrate is not needed to form the vertical-transport transistor devices disclosed herein, they can be formed as an independent layer at any level and be connected to other circuitry elements, such as, for example, memory elements. In at least one example, the vertical-transport transistor device could function as the driver transistor for an MRAM array. As such, the channel materials of the structure 100 proposed herein are not bound or limited by the base substrate material(s) because it is (a) formed in the back-end-of-line and (b) uses alternative channel materials such as non-crystalline silicon and various metal oxides.

Since a conventional silicon substrate is not needed to fabricate the disclosed transistor devices, they can be formed as an independent layer at any level and as routing density allows. For example, the transistor devices disclosed herein can be connected to other circuitry elements, such as, for example, an MRAM array and function as the driver transistors. Some monolithic-3D integration layering examples include (1) FEOL LOGIC including BEOL levels/Oxide transistors acting as MRAM memory drivers/MRAM array/ more layers with different functionalities above; (2) FEOL LOGIC including BEOL levels/MRAM array/Oxide transistors acting as MRAM memory drivers/more layers with different functionalities above; and (3) FEOL LOGIC including BEOL levels/Oxide transistors acting as MRAM memory drivers/MRAM array/Oxide transistors used for some sensors for example/more layers with different functionalities above.

Yet another distinctive notable feature of the structure 100 is its back-end-of-line compatibility. For example, process temperatures required to fabricate the disclosed structures are low enough to prevent damage to the pre-existing front-end-of-line, and specifically prevent metals in the front-end-of-line from melting and/or diffusing. The structure 100 proposed herein has an ultra-thin body, and thus a relatively small footprint, while maintaining sufficient current drivability required for high-performance devices used in embedded memory applications.

In all cases, the bottom source drain regions 106, the gate 112, and the top source drain regions 126 can be wired in any configuration. In at least one embodiment, for example, the bottom source drain regions 106 can be wired together. In another embodiment, for example, the top source drain regions 126 can be wired together. In yet another embodiment, for example, the bottom source drain regions 106 can be wired together and the top source drain regions 126 can be wired together. It is noted, any and all of the notable features described above with respect to the structure 100 apply equally to all structures disclose herein.

Figure 8:
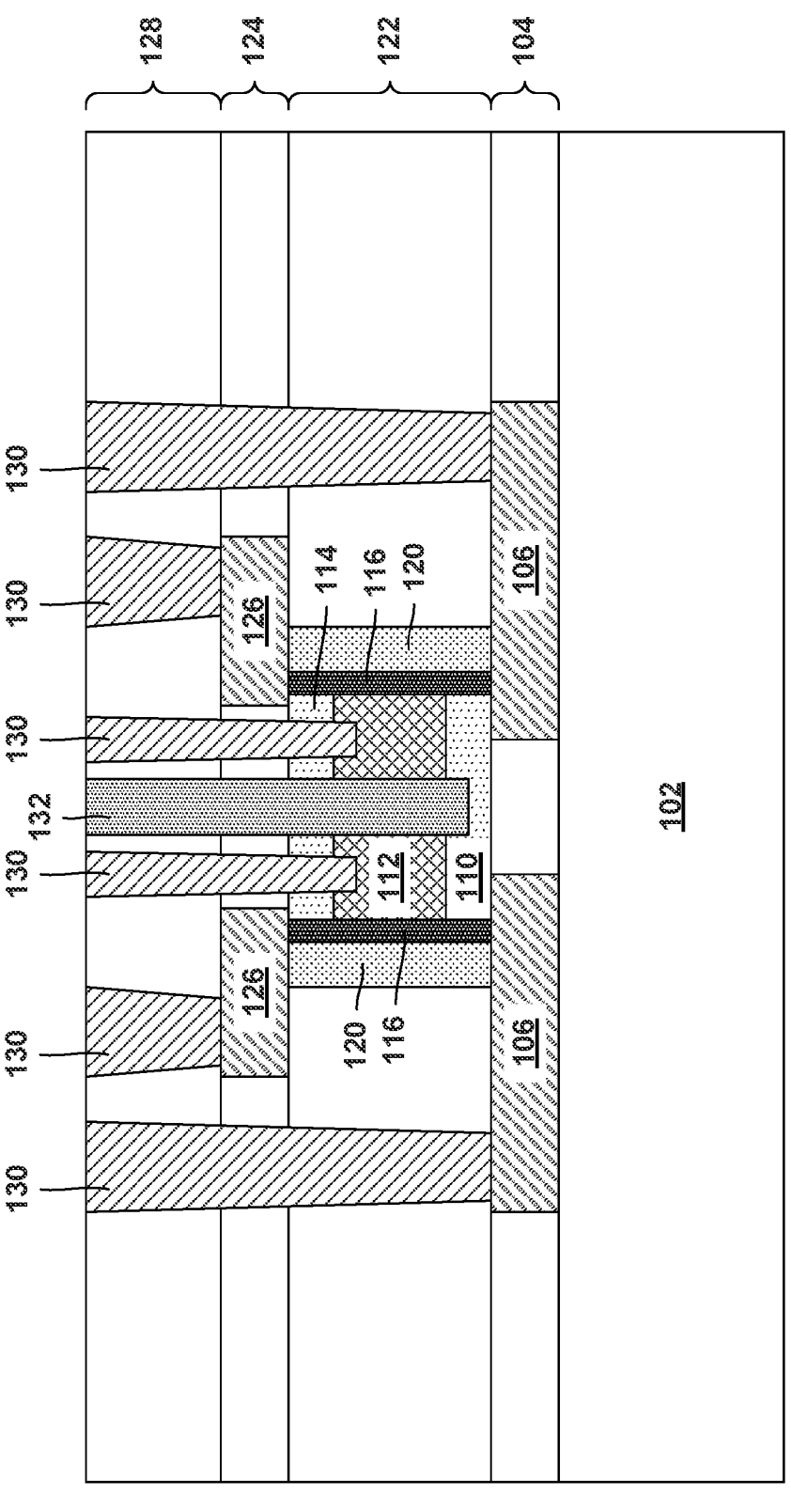
FIG. 8 is a cross-sectional view of the semiconductor structure after depositing the fourth dielectric layer, and forming the contact structures according to an exemplary alternative embodiment.

Referring now to FIG. 8, structure 200 is shown after depositing the fourth dielectric layer 128, and forming the contact structures 130 according to an alternative embodiment of the invention. In the present example, an additional trench isolator 132 can be added to split the structure 100 into two separate devices. Unlike the structure 100 which has a single gate 112, the structure 200, with the addition of the trench isolator 132, has two gates 112 thus forming two separate devices which can be operated independent of one another. In such cases, the two vertically oriented channel regions 120 can remain separate and operate as two separate devices. The structure 200 can also have various wiring configurations similar to those described above with respect to the structure 100. In practice, the additional trench isolator 132 would be oriented perpendicular to the source drain regions 106, 126 when the structure is viewed from the top down.

Figure 9:
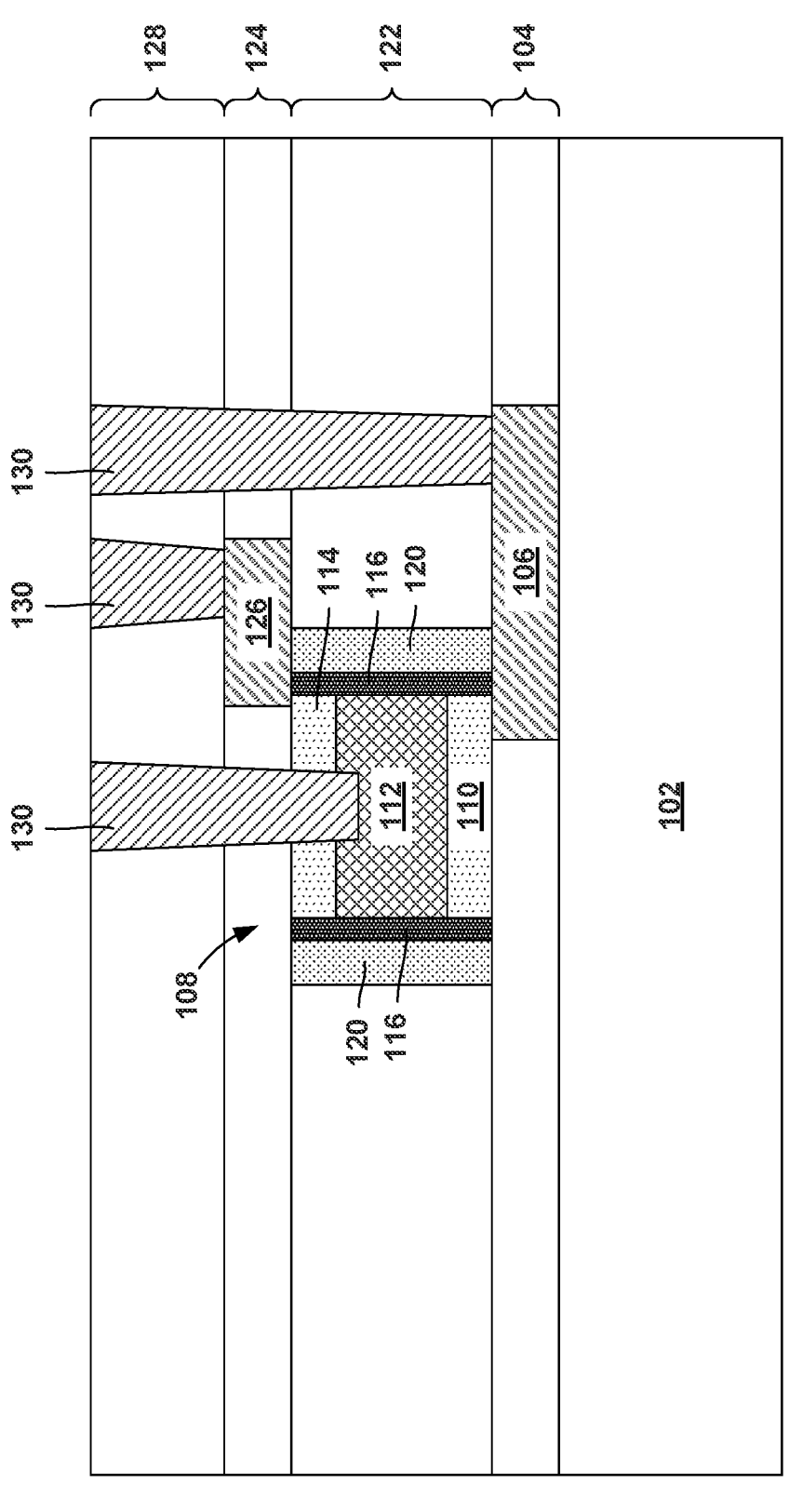
FIG. 9 is a cross-sectional view of the semiconductor structure after depositing the fourth dielectric layer, and forming the contact structures according to an exemplary alternative embodiment.
Figures 10, 11:
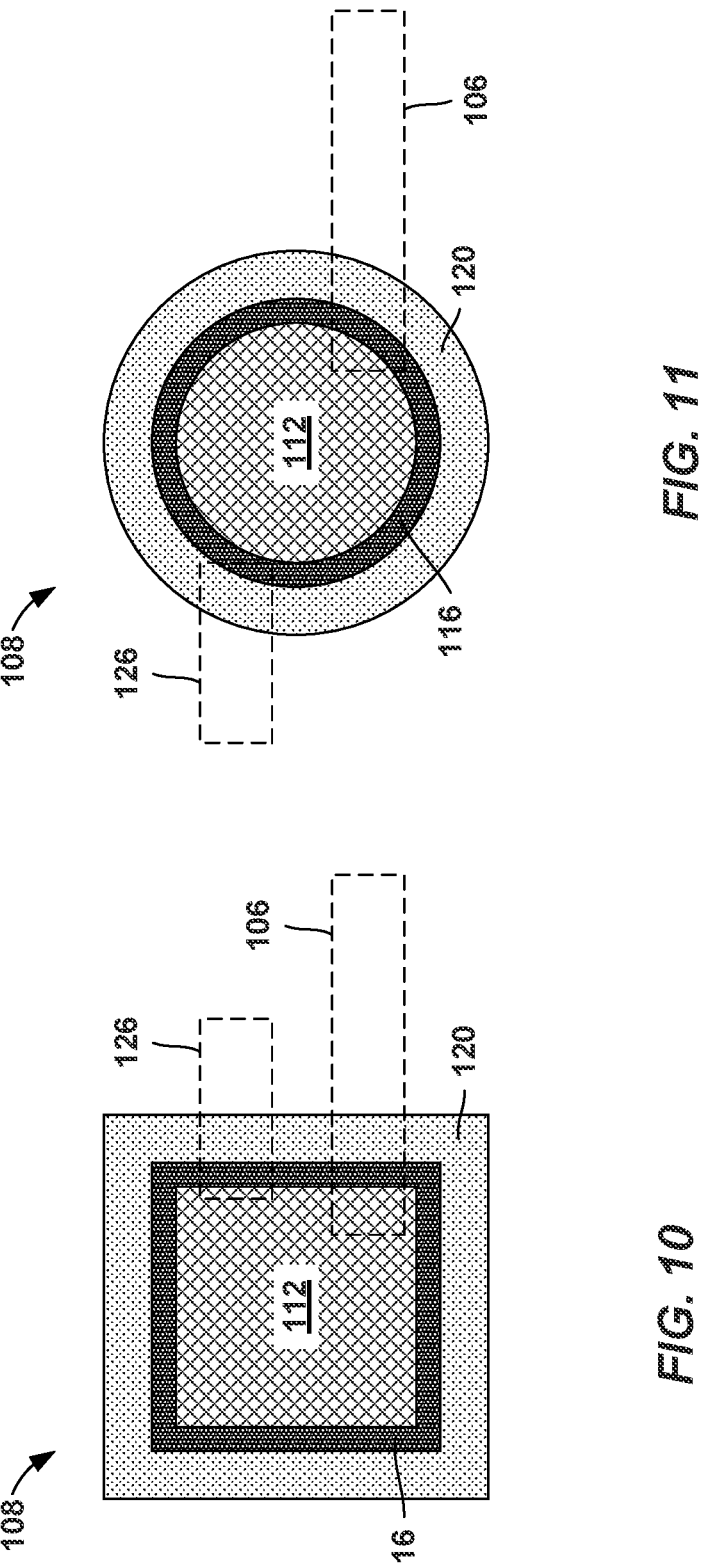
FIGS. 10 and 11 are representative top views of the structure shown in FIG. 9 according to exemplary embodiments.

Referring now to FIG. 9, structure 300 is shown after depositing the fourth dielectric layer 128, and forming the contact structures 130 according to an alternative embodiment of the invention. In the present example, the gate region 108 is completely surrounded by a single gate dielectric 116 and a single channel 120 connected to only one bottom source drain region 106 and a one top source drain region 126. In all cases, including the structure 100, the structure 200, and the structure 300, the gate region 108 could have a round or substantially round cross section, a square or substantially square cross section, a rectangular or substantially rectangular cross section, or other unique shape. Exemplary top views are shown in FIGS. 10 and 11. The exact cross-sectional shape of the gate region 108 is immaterial to the novelty, but could be tuned for optimal function, fabrication, or both. For example, the cross-sectional shape of the gate region 108 may be "U" shaped or even "Z" shaped.

It is noted the structure 300 of FIG. 9 is even more space efficient than the structure 100 of FIG. 7. Stated differently, the structure 300 of FIG. 9 has yet a smaller footprint than the structure 100 of FIG. 7 due in part to the existence of only one bottom source drain region 106 and only one top source drain region 126.

Referring now to FIGS. 10 and 11, representative top views of the structure 300 are shown. Specifically, FIG. 10 represents a vertical-transport transistor structure with a gate region 108 having a square or substantially square cross-section, and FIG. 11 represents a vertical-transport transistor structure with a gate region 108 having circular or substantially circular cross-section. In both top views depicted in FIGS. 10 and 11, the single channel 120 surrounds the gate region 108. It is further noted, alternative exemplary arrangements of the source drain regions (106, 126) are also illustrated in FIGS. 10 and 11. Although, the source drain configurations illustrated in FIGS. 10 and 11 are completely functional, improved performance can be achieved by reducing the distance from the bottom source drain region 106 to the top source drain region 126 through the channel (120). In practice, for example, portions of the source drain regions contacting the vertical channel 120 would be aligned vertically. Said differently, a portion of the top source drain region 126 contacting the channel (120) would be oriented directly above a portion of the bottom source drain region 106 contacting the channel (120).

Figure 12:
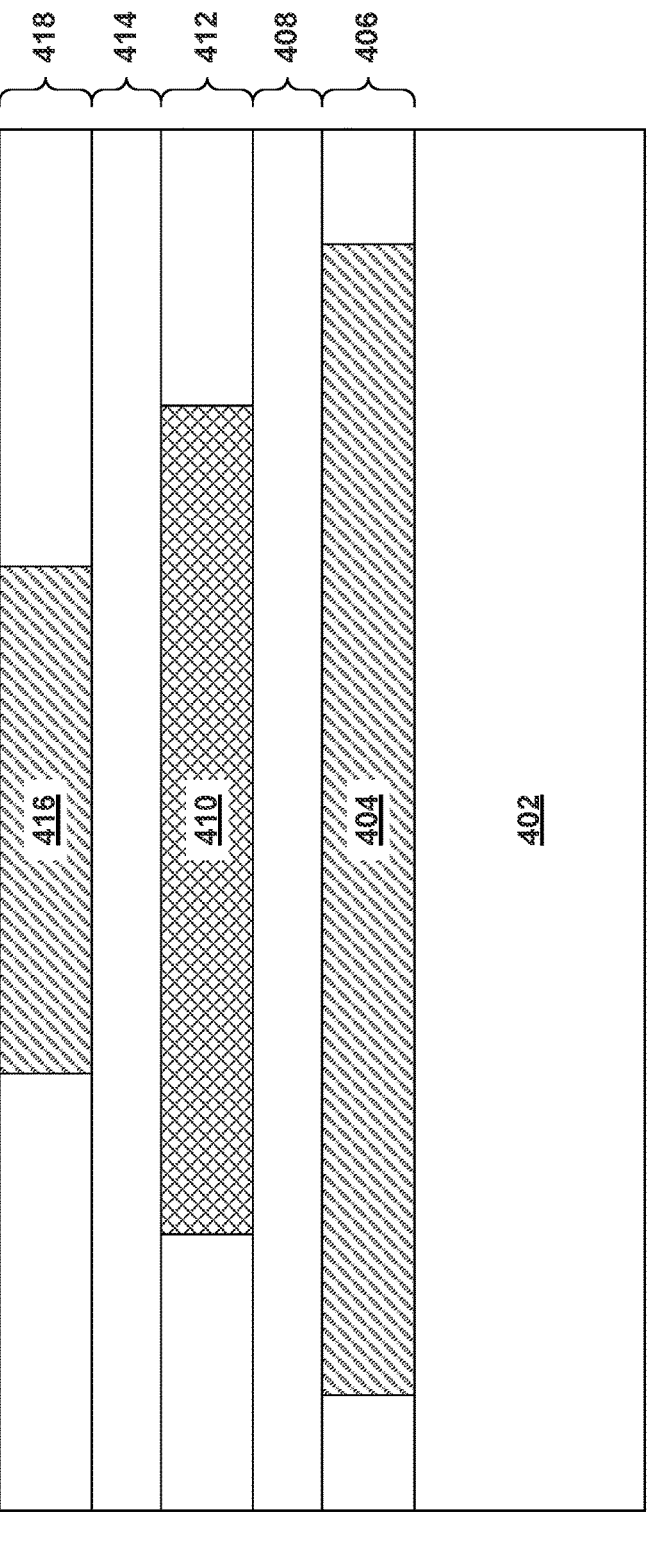
FIGS. 12-16 illustrate the steps of a method of forming a back-end-of-line vertical-transport transistor according to an alternative exemplary embodiment.

FIGS. 12-16 illustrate the steps of a method of forming a back-end-of-line vertical-transport transistor according to an exemplary alternative embodiment. Referring now to FIG. 12, a structure 400 is shown during an intermediate step of a method of fabricating a vertical-transport transistor structure integrated into the back-end-of-line according to an embodiment of the invention. Like the structures previously described above, the structure 400 illustrated in FIG. 12 includes an underlying circuit layer 402 similar to the underlying circuit layer 102 described above. Additionally, the structure 400 includes a first conductive region 404 in a first dielectric layer 406, a first spacer layer 408, a gate region 410 in a second dielectric layer 412, a second spacer layer 414, and a second conductive region 416 in a third dielectric layer 418.

The first conductive region 404 and the second conductive region 416 are formed in a similar manner and with similar materials as the bottom source drain regions 106 and the top source drain regions 126 described above. The first dielectric layer 406, the second dielectric layer 412, and the third dielectric layer 418 are formed in a similar manner and with similar materials as the dielectric layers (104, 122, 124) described above. The first spacer layer 408 and the second spacer layer 414 are formed in a similar manner and with similar materials as the bottom gate spacer 110 and the top gate spacer 114 described above.

Unlike the gate 112 described above, the gate region 410 cannot be metal. Instead, the gate region 410 of the structure 400 is made from any semiconductor material which may be subsequently oxidized to form a gate dielectric, such as, for example, polysilicon. In some embodiments, the gate region 410 may be doped or heavily doped with one or more dopants according to known techniques.

Figure 13:
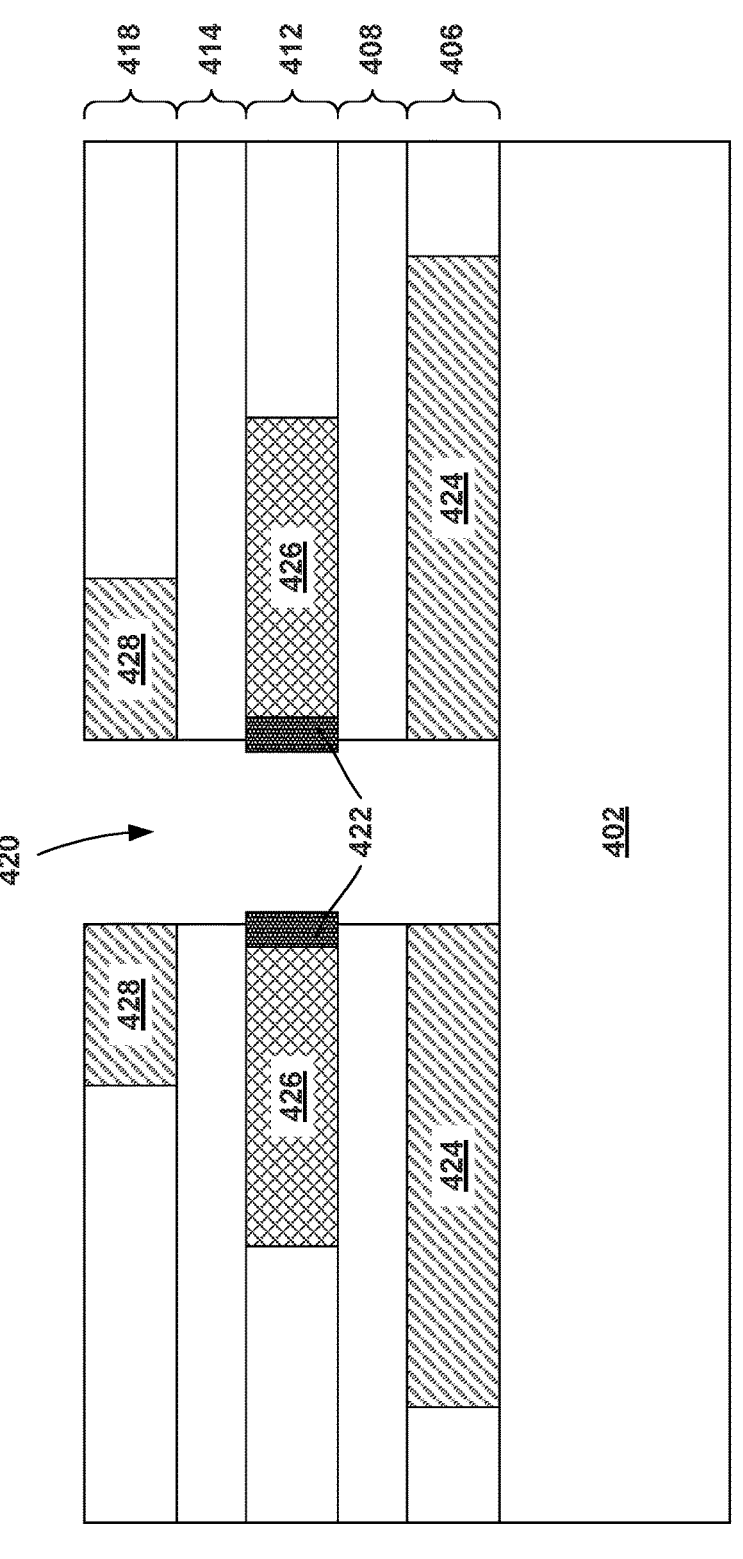

Referring now to FIG. 13, structure 100 is shown after forming etching a trench 420 and forming gate dielectric spacers 422 according to an embodiment of the invention.

First, known patterning and etching techniques may be used to form the trench 420 through an approximate center of the structure 400 and expose the underlying circuit layer 402. More specifically, the trench 420 extends through the first dielectric layer 406, the first spacer layer 408, the second dielectric layer 412, the second spacer layer 414, and the third dielectric layer 418, and divides the first conductive region 404, the gate region 410, and the second conductive region 416 into two parts. As illustrated, the divided portions of the first conductive region 404 form bottom source drain regions 424, the divided portions of the gate region 410 form gates 426, and the divided portions of the second conductive region 416 form top source drain regions 428.

Next, exposed sidewalls of the gates 426 may be selectively oxidized to form the gate dielectric spacers 422 according to known techniques. For example, techniques such as rapid thermal oxidation, high pressure wet oxidation, or low temperature oxidation can be used to oxidize the exposed sidewalls of the gate region 410. It is noted that after oxidation, the gate dielectric spacers 422 may partially extend into the trench 420.

Figure 14:
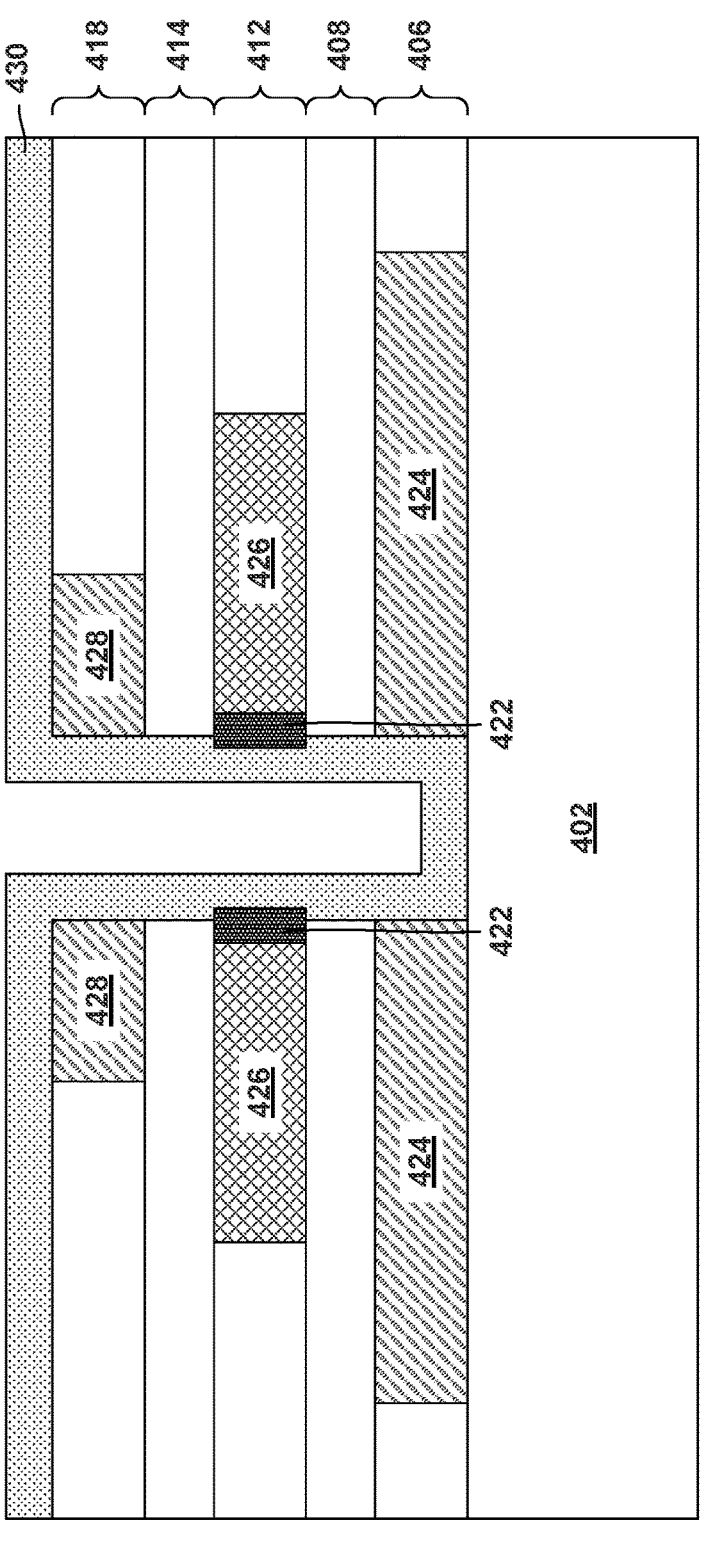

Referring now to FIG. 14, structure 400 is shown after forming a channel material layer 430 according to an embodiment of the invention. The channel material layer 430 is deposited over and across the entire structure 400 in a similar manner and with similar materials as the channel material layer 118 described above.

Figure 15:
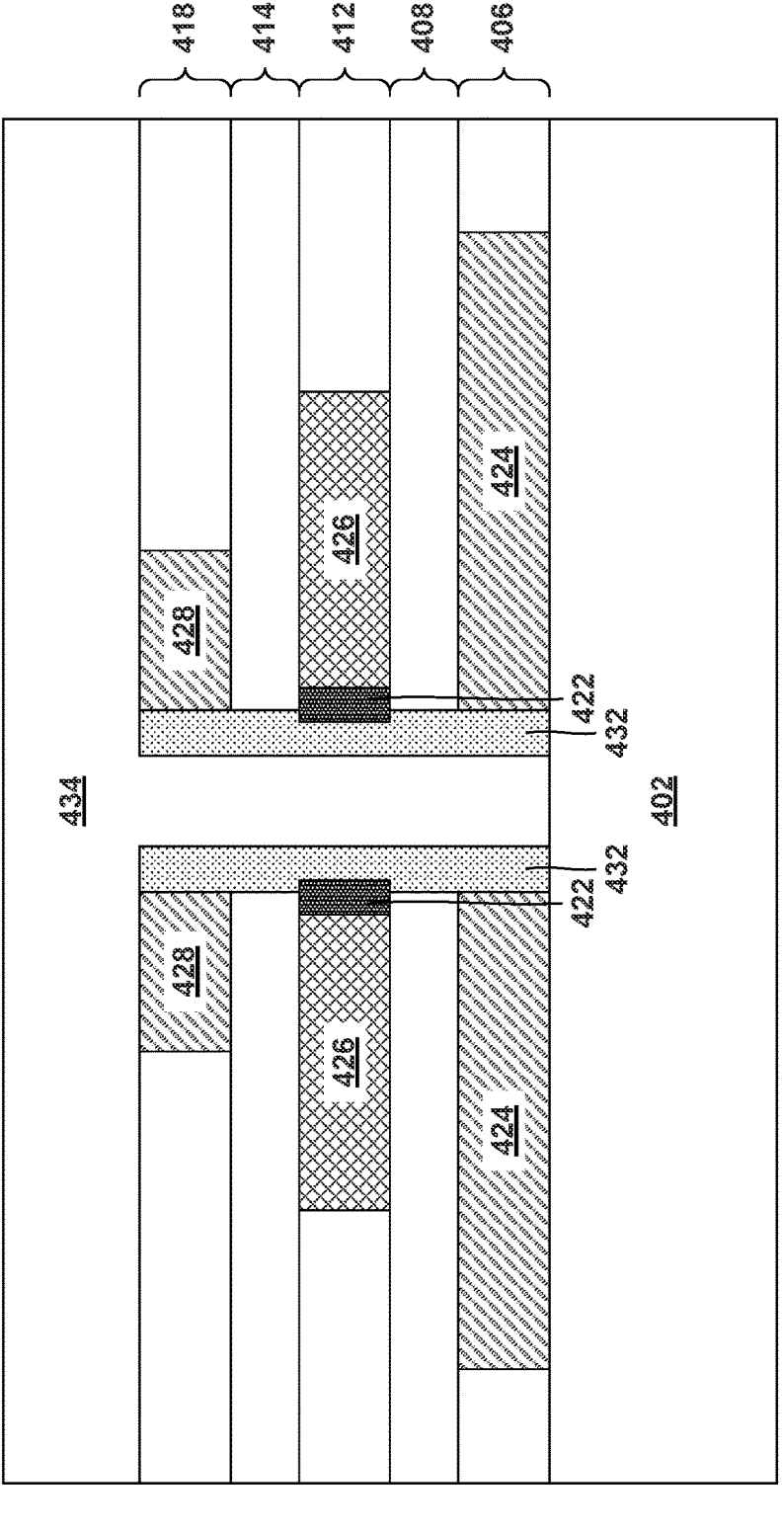

Referring now to FIG. 15, structure 400 is shown after etching the channel material layer 430 to form vertical channels 432 and depositing a fourth dielectric layer 434 according to an embodiment of the invention. The channel material layer 430 is etched in a similar manner as the channel material layer 118 described above. Further, the fourth dielectric layer 434 is deposited over and across the entire structure 400 in a similar manner and with similar materials as the second dielectric layer 122 described above.

Figure 16:
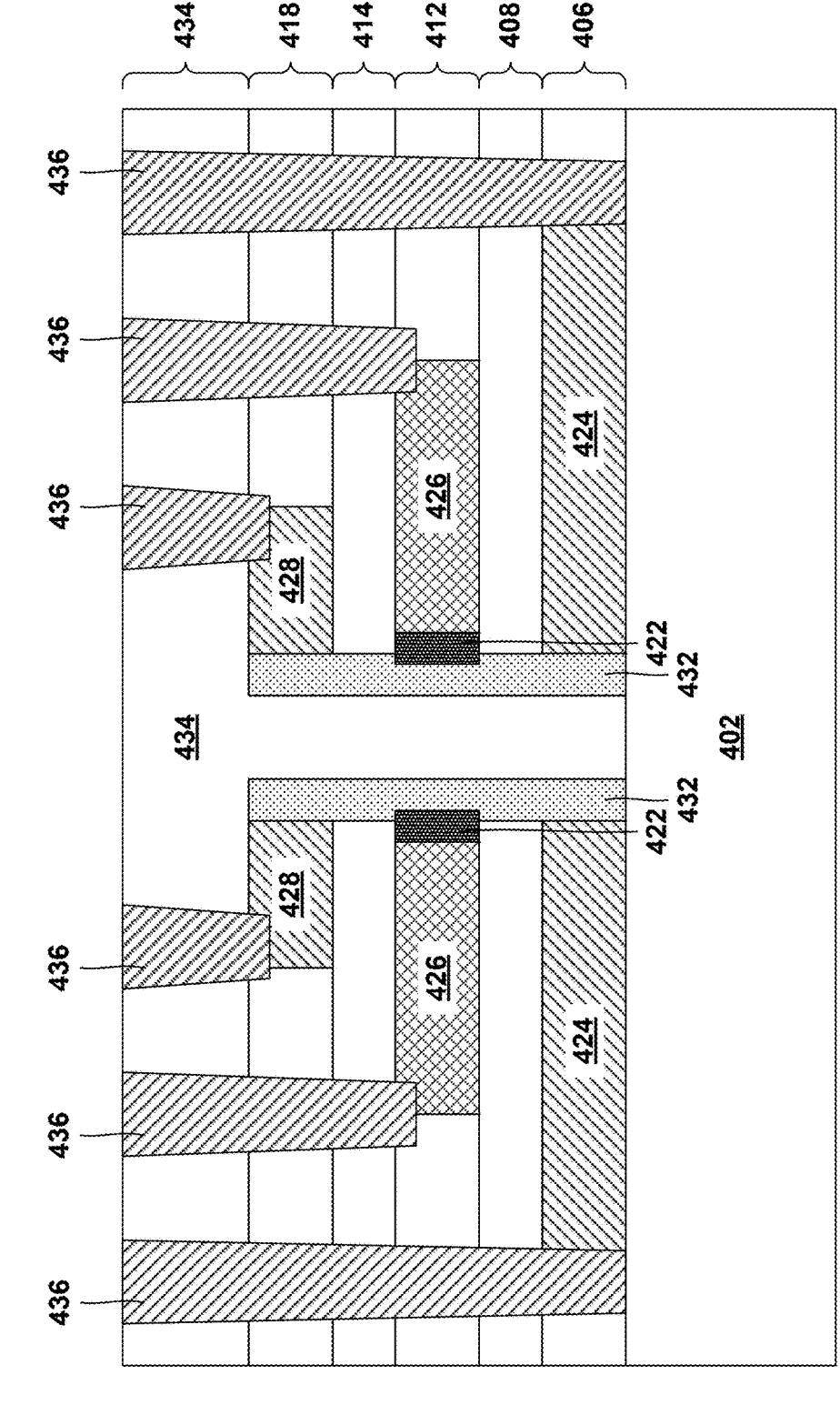

Referring now to FIG. 16, structure 400 is shown after forming contact structures 436 according to an embodiment of the invention. The contact structures 436 are formed in a similar manner and with similar materials as the contact structures 130 described above.

As illustrated in FIG. 16, the vertical-transport transistor device represented by the structure 400 in this example has some distinctive notable features. For instance, the structure 400 is symmetrical and includes two vertically oriented channel regions 432 controlled by two gates 426. As previously described, during operation carrier transport occurs vertically from the bottom source drain regions 424 to the top source drain regions 428, or vice versa. Unlike the structure 100 described above, the structure 400 of the present example includes two separate and distinct vertical-transport devices each having their own source drain regions and gates.

Additionally, like the structure 100 described above, the structure 400 is back-end-of-line compatible and uses similar channel materials which are not bound or limited by the base substrate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a bottom source drain region arranged above front-end-of-line circuitry;
   a gate region disposed above and insulated from the bottom source drain region;
   a top source drain region disposed above and insulated from the gate region;
   a channel region adjacent to the gate region and extending vertically from a top surface of the bottom source drain region to a bottom surface of the top source drain region; and
   a gate dielectric separating the gate region from the channel region, wherein the channel region wraps around and directly contacts a bottom surface, a sidewall, and a top surface of the gate dielectric.

2. The semiconductor structure according to claim 1, further comprising:
   a bottom contact partially embedded into the bottom source drain region;
   a top contact partially embedded into the top source drain region; and
   a gate contact partially embedded into the gate region.

3. The semiconductor structure according to claim 1, further comprising:

a bottom gate spacer between and physically separating the gate region from the bottom source drain region; and a top gate spacer between and physically separating the gate region from the top source drain region.

4. The semiconductor structure according to claim 1, wherein a width of the bottom source drain region is greater than a width of the gate region, and wherein the width of the gate region is greater than a width of the top source drain region.

5. The semiconductor structure according to claim 1, wherein a height of the gate dielectric is substantially equal to a height of the gate region.

6. The semiconductor structure according to claim 1, wherein the channel region comprises indium oxide, indium tin oxide, indium gallium zinc oxide, indium aluminum zinc oxide, amorphous silicon, polysilicon, or some combination thereof.

7. A semiconductor structure comprising:

two or more bottom source drain regions arranged above front-end-of-line circuitry and electrically isolated from one another;

a single gate region disposed above and insulated from the two or more bottom source drain regions;

a trench isolator between and physically separating a first portion of the single gate region from a second portion of the single gate region, wherein sidewalls of the trench isolator directly contact a sidewall of the first portion of the single gate region and a sidewall of the second portion of the single gate region;

two or more top source drain regions disposed above and insulated from the single gate region and electrically isolated from one another; and two or more channel regions adjacent to the single gate region, each channel region extending vertically from a top surface of one of the two or more bottom source drain regions to a bottom surface of one of the two or more top source drain regions.

8. The semiconductor structure according to claim 7, further comprising:

two or more bottom contacts, wherein each of the two or more bottom contacts is partially embedded into one of the two or more bottom source drain regions;

two or more top contacts, wherein each of the two or more top contacts is partially embedded into one of the two or more top source drain regions;

a first gate contact partially embedded into the first portion of the single gate region; and a second gate contact partially embedded into the second portion of the single gate region.

9. The semiconductor structure according to claim 7, further comprising:

a first gate dielectric separating the first portion of the single gate region from a first channel of the two or more channel regions, wherein a height of the first gate dielectric is substantially equal to a height of the two or more channel regions measured from the top surface of the two or more bottom source drain regions to the bottom surface of the two or more top source drain regions; and a second gate dielectric separating the second portion of the single gate region from a second channel of the two or more channel regions, wherein a height of the second gate dielectric is substantially equal to the height of the two or more channel regions measured from the top surface of the two or more bottom source drain regions to the bottom surface of the two or more top source drain regions.

10. The semiconductor structure according to claim 7, wherein a width of one of the two or more bottom source drain regions is greater than a width of one of the two or more top source drain regions.

11. The semiconductor structure according to claim 7, further comprising:

a bottom gate spacer directly below the single gate region insulating the single gate region from the two or more bottom source drain regions; and a top gate spacer above the single gate region insulating the single gate region from the two or more top source drain regions.

12. The semiconductor structure according to claim 7, further comprising:

a bottom gate spacer directly below the single gate region insulating the single gate region from the two or more bottom source drain regions; and a top gate spacer above the single gate region insulating the single gate region from the two or more top source drain regions, wherein a combined height of the bottom gate spacer, the single gate region, and the top gate spacer is equal to a height of the two or more channel regions.

13. The semiconductor structure according to claim 7, wherein the two or more channel regions comprises indium oxide, indium tin oxide, indium gallium zinc oxide, indium aluminum zinc oxide, amorphous silicon, polysilicon, or some combination thereof.

14. The semiconductor structure according to claim 7, wherein a bottommost surface of the trench isolator is below bottommost surfaces of both the first portion of the single gate region and the second portion of the single gate region, and wherein a topmost surface of the trench isolator is substantially flush with topmost surfaces of two or more bottom contacts, two or more top contacts, a first gate contact, and a second gate contact.

15. A semiconductor structure comprising:

a bottom source drain region arranged above front-end-of-line circuitry;

a single gate region disposed above and insulated from the bottom source drain region;

a top source drain region disposed above and insulated from the single gate region;

a channel region surrounding the single gate region, the channel region extending vertically from a top surface of the bottom source drain region to a bottom surface of the top source drain region;

a bottom gate spacer directly below the single gate region insulating the single gate region from the bottom source drain region; and a top gate spacer above the single gate region insulating the single gate region from the top source drain region, wherein the bottom gate spacer, the single gate region, and the top gate spacer have substantially equal widths.

16. The semiconductor structure according to claim 15, further comprising:

gate dielectric separating the single gate region from the channel region, each of the gate dielectric extend vertically from a top surface of the bottom source drain region to a bottom surface of the top source drain region.

17. The semiconductor structure according to claim 15, wherein a width of the bottom source drain region is greater than a width of the top source drain region.

18. The semiconductor structure according to claim 15, wherein a combined height of the bottom gate spacer, the single gate region, and the top gate spacer is equal to a height of the channel region.

19. The semiconductor structure according to claim 15, wherein the channel region comprises indium oxide, indium tin oxide, indium gallium zinc oxide, indium aluminum zinc oxide, amorphous silicon, polysilicon, or some combination thereof.

20. The semiconductor structure according to claim 15, further comprising:

a dielectric layer surrounding and electrically insulating the channel region from adjacent structures embedded in the dielectric layer.

* * * * *